(12) United States Patent
Chen et al.

(10) Patent No.: US 11,215,886 B2
(45) Date of Patent: Jan. 4, 2022

(54) DISPLAY PANEL AND DISPLAY DEVICE

(71) Applicant: TCL China Star Optoelectronics Technology Co., Ltd., Shenzhen (CN)

(72) Inventors: Jianhong Chen, Shenzhen (CN); Peng Du, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 148 days.

(21) Appl. No.: 16/626,326

(22) PCT Filed: Nov. 21, 2019

(86) PCT No.: PCT/CN2019/120014
§ 371 (c)(1),
(2) Date: Dec. 24, 2019

(87) PCT Pub. No.: WO2021/051641
PCT Pub. Date: Mar. 25, 2021

(65) Prior Publication Data
US 2021/0294164 A1    Sep. 23, 2021

(30) Foreign Application Priority Data

Sep. 17, 2019   (CN) .......................... 201910875462.0

(51) Int. Cl.
*G02F 1/1362* (2006.01)
*G02F 1/1345* (2006.01)

(52) U.S. Cl.
CPC .... *G02F 1/136209* (2013.01); *G02F 1/13458* (2013.01)

(58) Field of Classification Search
None
See application file for complete search history.

(56) References Cited

U.S. PATENT DOCUMENTS

| 10,634,958 | B1 | 4/2020 | Deng |
| 2014/0085585 | A1 | 3/2014 | Sung et al. |
| 2017/0082900 | A1 | 3/2017 | Kong et al. |
| 2019/0204669 | A1 | 7/2019 | Lee et al. |

FOREIGN PATENT DOCUMENTS

| CN | 104614908 | 5/2015 |
| CN | 106547152 | 3/2017 |
| CN | 108153070 | 6/2018 |
| CN | 108490700 | 9/2018 |
| CN | 108535909 | 9/2018 |
| CN | 110109300 | 8/2019 |

*Primary Examiner* — Richard H Kim

(57) ABSTRACT

A display panel includes an array substrate, a counter substrate, and at least one chip-on-film (COF), each COF is electrically connected to the conductive region via a printed circuit. The conductive region and the printed circuit corresponding to the conductive region include a first contact and a second contact. Besides, the array substrate is provided with a first blocking structure and a second blocking structure.

15 Claims, 4 Drawing Sheets

DISPLAY PANEL AND DISPLAY DEVICE

RELATED APPLICATIONS

This application is a National Phase of PCT Patent Application No. PCT/CN2019/120014 having International filing date of Nov. 21, 2019, which claims the benefit of priority of Chinese Patent Application No. 201910875462.0 filed on Sep. 17, 2019. The contents of the above applications are all incorporated by reference as if fully set forth herein in their entirety.

FIELD AND BACKGROUND OF THE INVENTION

A display device includes a display panel and a driver IC (integrated circuit) used for driving the display panel, wherein the driver IC is provided for a source driver and a gate driver for display driving. Currently, the driver IC utilizing chip-on-film (COF) packaging technology is adopted in various display panels such as liquid crystal display (LCD) and organic light-emitting diode (OLED).

As the name implies, the COF packaging technology is a technology that fixes a driver IC on a grain film of a flexible printed circuit (FPC). In a driving circuit, one end of the COF connects to a printed circuit board (PCB) and is responsible for receiving data signals transmitted by the printed circuit board, and another end of the COF connects to a display panel and is used to transmit data signals outputted by the driver IC to the display panel to drive the display panel display.

During a process of manufacturing the display device, such as a process of manufacturing an OLED display or a LCD, a connection between the PCB and the COF and a connection between the COF and the display panel are performed by a bonding process. More particularly to the bonding process of the connection between the COF and the display panel, a wide width is occupied and this results in a wide width of a peripheral area (non-display area), which makes it difficult for a width compression ratio of a bezel of the display panel. A lateral-side bonding process is a bonding technology used to attach the COF to a lateral side of the display panel by adopting the same size of an upper substrate and a lower substrate, it can reduce the peripheral area of the display device, and this is meaningful for narrow bezel or joined screens.

Lateral-side bonding will cause problems such as a large contact impedance between the COF and a bonding region of the display panel, and connection easily established between adjacent circuits of the COF. Currently, the connection problem can be overcome by increasing the spacing between conductive regions in the display panel. However, it will cause the width of the COF become larger, the bonding difficulty will increase, and even the bonding process cannot be performed. Therefore, there is an urgent need to provide a display panel having a large conductive area and capable of preventing a metal material used in conductive circuits from being connected to each other to overcome these problems.

SUMMARY OF THE INVENTION

The objective of the present application is to provide a display panel and a display device using the display panel, in which the display panel can reduce on-resistance between a chip-on-film (COF) and the display panel, and meanwhile the display panel and the display panel with the COF can prevent adjacent printed circuits from being connected to each other to increase the yield of the display panel. Finally, the display panel and display panel with the COF can prevent a material used in the printed circuit from overflowing to a display area to ensure display effect.

In order to achieve above objective, technical solutions adopted in the present application are described as follows:

A display panel, including:

an array substrate, of which a peripheral region includes at least one conductive region arranged at intervals and at least one non-conductive region spaced apart from the conductive region;

a counter substrate, disposed opposite to the array substrate; and at least one chip-on-film (COF), each COF electrically connected to the conductive region via a printed circuit, wherein the conductive region and the printed circuit corresponding to the conductive region include:

a first contact located at a lateral side of the display panel; and a second contact located at a side of the conductive region facing the counter substrate, wherein a side of each non-conductive region facing the counter substrate is further provided with:

at least one first blocking structure configured to prevent adjacent printed circuits from being connected to each other; and at least one second blocking structure located at one end of the conductive region near the printed circuit to prevent a metal material used in the printed circuit from overflowing to a display region.

Further, the printed circuit and the counter substrate include:

a third contact located at a lateral side of the display panel; and a fourth contact located at a side of the counter substrate facing the array substrate.

A display panel, including:

an array substrate, of which a peripheral region includes at least one conductive region arranged at intervals and at least one non-conductive region spaced apart from the conductive region;

a counter substrate, disposed opposite to the array substrate; and at least one chip-on-film (COF), each COF electrically connected to the conductive region via a printed circuit, wherein the conductive region and the printed circuit corresponding to the conductive region include:

a first contact located at a lateral side of the display panel; and a second contact located at a side of the conductive region facing the counter substrate.

Further, a side of each non-conductive region facing the counter substrate is provided with at least one first blocking structure, which is configured to prevent adjacent printed circuits from being connected to each other.

Further, the first blocking structure is a photospacer layer.

Further, the first blocking structure includes a color resist layer and a photospacer layer disposed at a side of the color resist layer away from the array substrate.

Further, a side of each conductive region facing the counter substrate is provided with at least one second blocking structure, which is located at one end of the conductive region near the printed circuit to prevent a metal material used in the printed circuit from overflowing to a display region.

Further, the second blocking structure is a photospacer layer.

Further, the second blocking structure includes a color resist layer and a photospacer layer disposed at a side of the color resist away from the array substrate.

Further, the peripheral region of the array substrate includes a substrate, a gate electrode layer, a gate insulation layer, a source electrode layer, a passivation layer, and a pixel electrode layer along a direction from the array substrate to the counter substrate.

Further, the non-conductive region includes the substrate, the gate insulation layer, and the passivation layer.

Further, the peripheral region of the array substrate includes a substrate, a gate electrode layer, a gate insulation layer, a source electrode layer, a passivation layer, an insulation layer, and a pixel electrode layer along a direction from the array substrate to the counter substrate.

Further, a region of the insulation layer corresponding to the second contact is provided with a hollow region, and the pixel electrode layer covers the hollow region and forms a stepped surface.

Further, the insulation layer is formed by one or more than one of silicon oxide (SiOx) and silicon nitride (SiNx).

Further, the insulation layer is formed by one or more than one of transparent colorless polyimide, polyurethane, polyethylene terephthalate and polyethylene naphthalate.

Further, the non-conductive region includes the substrate, the gate insulation layer, the passivation layer and the insulation layer.

Further, a region of the insulation layer corresponding to the non-conductive region is provided with a protrusion, and one end of the protrusion away from the substrate is more prominent than the conductive region.

Further, the printed circuit and the counter substrate include:

a third contact located at a lateral side of the display panel; and a fourth contact located at a side of the counter substrate facing the array substrate.

Further, the printed circuit is a silver printed circuit.

A display device, including a display panel, wherein the display panel includes:

an array substrate, of which a peripheral region includes at least one conductive region arranged at intervals and at least one non-conductive region spaced apart from the conductive region;

a counter substrate, disposed opposite to the array substrate; and at least one chip-on-film (COF), each of the COF electrically connected to the conductive region via a printed circuit, wherein the conductive region and the printed circuit corresponding to the conductive region include:

a first contact located at a lateral side of the display panel; and a second contact located at a side of the conductive region facing the counter substrate.

Compared to the existing lateral-side bonding technology, the conductive area is increased and the contact impedance is reduced by adding the second contact between the printed circuit and the conductive region, thereby increasing the stability of connected circuits between the COF and the display panel. By providing the first blocking structure capable of blocking adjacent conductive regions, the display panel described in the present application can prevent the adjacent printed circuits from being connected to each other. By providing the second blocking structure, the display panel described in the present application can prevent a metal layer used in the printed circuit from overflowing to the display area, thereby preventing poor display effect.

DESCRIPTION OF SPECIFIC EMBODIMENTS OF THE INVENTION

The technical solutions in the embodiments of the present application will be clearly and completely described below in conjunction with the drawings in the embodiments of the present application. Obviously, the embodiments described are only a portion of the embodiments of the present application, not all of them. The spatially relative terms mentioned in the present invention, such as "upper", "lower", "front", "back", "left", "right", "top", "bottom" are only directions with referring to the accompanying drawings. Therefore, the spatially relative terms used are merely for describing and understanding the present application, it is not intended to limit the present invention.

The embodiments provide a display panel. Persons skilled in the art can understand that the display panel may be a liquid crystal display panel, an OLED display panel, or the like. That is, the display panel described in the present application is not limited to the type of the display panel described in the embodiments of the present application.

Figure 1:
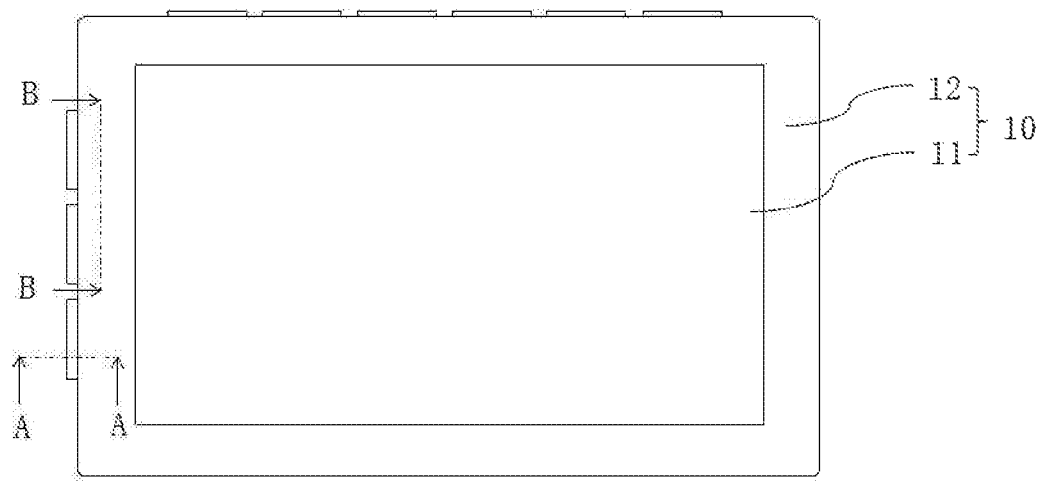
FIG. 1 is a schematic structural diagram showing an overall structure of a display panel according to the present application.

As shown in FIG. 1, an embodiment of the present application provides a display panel 10, which is a liquid crystal display panel and includes a display region 11 and a peripheral region 12 surrounding the periphery of the display region 11.

Figure 2:
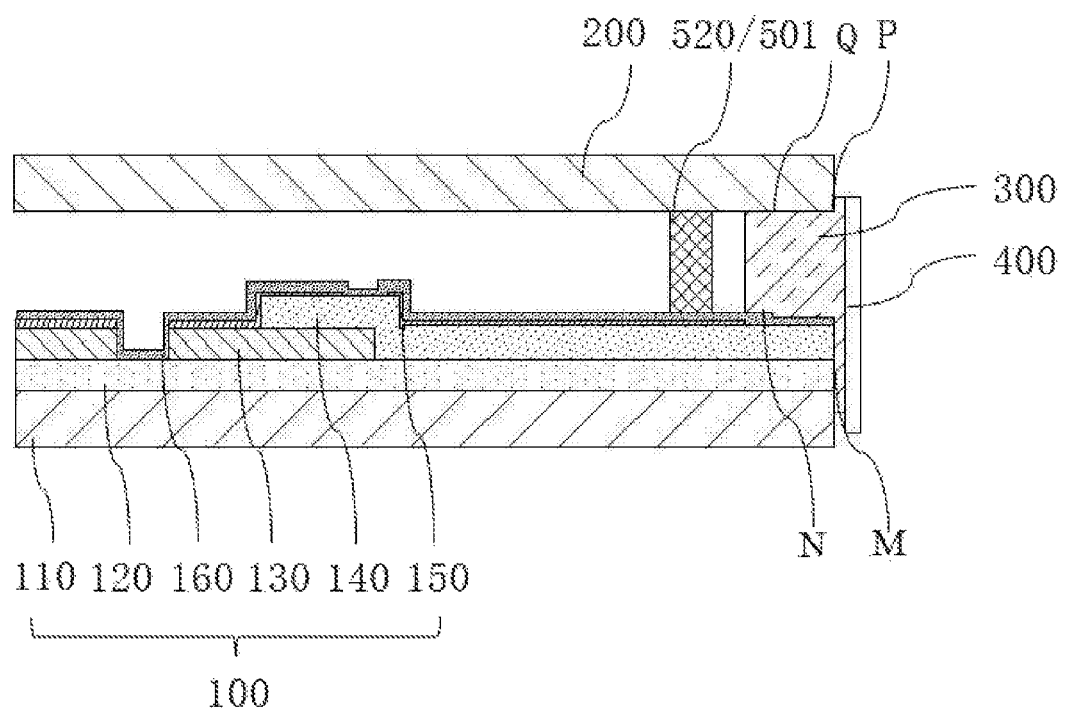
FIG. 2 is a cross-sectional view of the display panel, taken along A-A direction in FIG. 1, according to a first embodiment of the present invention.
Figure 3:
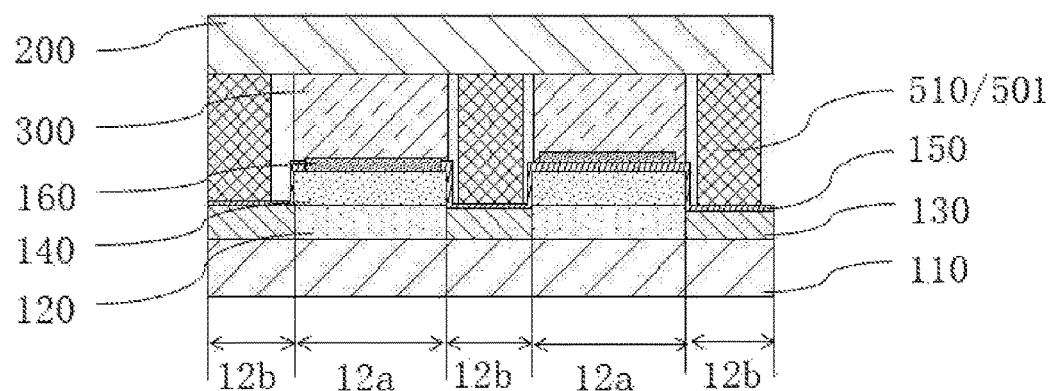
FIG. 3 is a cross-sectional view of the display panel, taken along B-B direction in FIG. 1, according to the first embodiment of the present invention.

FIG. 2 and FIG. 3 are schematic structural diagrams of the peripheral region 12 of the display panel 10, taken along A-A direction and B-B direction, respectively, according to a first embodiment of the present application. The specific structural characteristics of the display panel 10 will be described in detail below in conjunction with FIG. 2 and FIG. 3.

As shown in FIG. 2 and FIG. 3, the display panel 10 includes an array substrate 100, a counter substrate 200 disposed opposite to the array substrate 100, at least one printed circuit 300, and at least one chip-on-film (COF) 400. A side of a peripheral area of the array substrate 100 facing the counter substrate 200 includes at least one conductive region 12a and at least one non-conductive region 12b distanced from the conductive region 12a. Each COF 400 is electrically connected to the conductive region 12a via the printed circuit 300.

Referring to FIG. 2 and FIG. 3 again, the conductive region 12a and the printed circuit 300 corresponding to the conductive region 12a includes a first contact M located at a lateral side of the array substrate 100 of the display panel 10 and a second contact N located at a side of the conductive region 12a facing the counter substrate 200.

Specifically, the present application is equivalent to adding the second contact N on the basis of the prior art to increase a contact area between the printed circuit 300 and the conductive region 12a, thereby increasing the conductive efficiency between the printed circuit 300 and the conductive region 12a and increasing the stability of the electrical connection between the COF 400 and the display panel 10.

The connection between the COF 400 and the display panel 10 is achieved via the printed circuit 300, which avoids a problem of bending the COF 400 in order to increase the conductive contact area in the prior art. Besides, since a thickness of the printed circuit 300 is small, a width of the peripheral region 12 will not be increased additionally, as well as a thickness of the display panel 10 will not be increased. It is beneficial to achieve a narrow bezel or a bezel-less design of the display panel 10.

It should be noted that "non-conductive" mentioned in describing the non-conductive region 12b of the array substrate 100 in the present application means that the non-conductive region 12b is required not to affect an original electrical connection relationship and a corresponding relationship between the conductive region 12a and the printed circuit 300, and also does not affect the electrical connection relationship between the printed circuit 300 and the COF 400. Therefore, a surface of the non-conductive region 12b is insulated at least, and all film layers or materials constituting the non-conductive region 12b may all be insulating materials, or a material of the surface of the non-conductive region 12b may be an insulating material and a material of the inside of the non-conductive region 12b contains non-insulating materials such as semiconductor materials and metal materials.

A side of the array substrate 100 facing the counter substrate 200 includes a display area corresponding to the display region 11 of the display panel 10 and a peripheral area corresponding to the peripheral region 12 of the display panel 10.

At least one TFT arranged in an array is disposed in the display area of the array substrate 100. The TFT can control the light emission of each of sub-pixels, or may control an amount of light emitted by each of sub-pixels.

It should be pointed out that, first, the present application is not limited by the specific structure of the display area of the array substrate 100. That is, the present application is not limited by the arrangement of the TFT and structures or types of the TFT.

Referring to FIG. 2 and FIG. 3 continuedly, the peripheral area of the array substrate 100 includes at least one conductive region 12a and at least one non-conductive region 12b distanced therefrom. Each non-conductive region 12b is disposed between adjacent conductive regions 12a. That is, if the peripheral area of the array substrate 100 includes a plurality of conductive regions and a plurality of conductive regions, the conductive regions are arranged at intervals and each non-conductive region is disposed between spacing of the conductive regions.

It needs to be noted that the peripheral area of the array substrate 100 includes at least one conductive region 12a and at least one non-conductive region 12b, but is not limited particularly to the conductive region 12a and the non-conductive region 12b. Moreover, a specific structure of the peripheral area of the array substrate 100 except the conductive region 12a and the non-conductive region 12b is not limited in the present application.

Referring to FIG. 2 and FIG. 3 continuedly, the peripheral area of the array substrate 100 includes a substrate 110, a gate electrode layer 120, a gate insulation layer 130, a source electrode layer 140, a passivation layer 150, and a pixel electrode layer 160 along a direction from the array substrate 100 to the counter substrate 200.

Referring to FIG. 2 and FIG. 3 continuedly, the gate electrode layer 120 is disposed on the substrate 110, and the gate electrode layer 120 corresponding to the non-conductive region 12b forms a hollow. The gate insulation layer 130 is located at a side of the gate electrode layer 120 away from the substrate 110, and the gate insulation layer 130 covers the hollow of the gate electrode layer 120. Within a range of the gate insulation layer 130 corresponding to the conductive region 12a, the gate insulation layer 130 is provided with vias. The source electrode layer 140 is stacked on the gate insulation layer 130, and the source electrode layer 140 corresponding to the non-conductive region 12b forms a hollow, the source electrode layer 140 is electrically connected to the gate electrode layer 120 through the vias formed on the gate insulation layer 130. The passivation layer 150 is disposed on the source electrode layer 140, and the passivation layer 150 covers the hollow of the source electrode layer 140. Within a range of the passivation layer 150 corresponding to the conductive region 12a, the passivation layer 150 is provided with vias. The pixel electrode layer 160 is disposed at a side of the passivation layer 150 away from the substrate 110, and the pixel electrode layer 160 corresponding to the non-conductive region 12b forms a hollow, the pixel electrode layer 160 is electrically connected to the source electrode layer 140 through vias formed on the passivation layer 150.

Accordingly, the conductive region 12a includes the substrate 110, the gate electrode layer 120, the source electrode layer 140, the passivation layer 150, and the pixel electrode layer 160, the non-conductive region 12b includes the substrate 110, the gate insulation layer 130, and the passivation layer 150.

Specifically, the substrate 110 may be formed by suitable materials such as glass, quartz, metal, and plastic materials including polyethylene terephthalate (PET), polyethylene naphthalate (PEN), and polyimide. In the embodiment, the substrate 110 adopts a Polyimide (PI) substrate with better bending performance.

Specifically, in consideration of conductivity, each of the source electrode layer 140, the gate electrode layer 120, and the pixel electrode layer 160 may be formed by a single material or a composite material selected from at least one of aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu) or other suitable alloy. In an actual manufacturing process, each of the source electrode layer 140, the gate electrode layer 120, and the pixel electrode layer 160 may be formed by depositing metal layers and etching the metal layers (for example, by wet-etching).

In other embodiments or other types of display panel, in consideration of issues such as the light transmittance of the display region 11, the pixel electrode layer 160 may be made of a transparent electrode material such as indium tin oxide (ITO), indium zinc oxide (IZO), zinc oxide (ZnO) or indium oxide ($In_2O_3$).

Specifically, the gate insulation layer (GI) 130 is formed by one or more than one of silicon oxide (SiOx) and silicon nitride (SiNx). In an actual manufacturing process, the gate insulation layer 130 is formed by a plasma-enhanced chemical vapor deposition process.

Specifically, a material of the passivation layer 150 is one or more than one of silicon oxide (SiOx) and silicon nitride (SiNx). An approach for forming the passivation layer 150 includes chemical vapor deposition (CVD) or other applicable approaches.

Referring to FIG. 3 continuedly, at a side of each non-conductive region 12b facing the counter substrate 200, each non-conductive region 12b is provided with at least one first blocking structure 510, which is configured to prevent adjacent printed circuits 300 from being connected to each other.

Specifically, the first blocking structure 510 is formed at a side of the gate insulation layer 130 away from the substrate 110 in the non-conductive region 12b, and a side of the first blocking structure 510 away from the array substrate 100 is in contact with the counter substrate 200.

It should be noted that, for a liquid crystal display panel, the first blocking structure 510 can not only prevent the printed circuit 300 from being connected to each other, but also support a liquid crystal cell.

Specifically, the first blocking structure 510 may use a photospacer layer 501 or a black matrix as a raw material. In the embodiment, the first blocking structure 510 is a photospacer (PS) layer 501. The photospacer layer 501 may be an organic film layer, and may also be formed by light-sensitive materials such as photoresist.

In an actual manufacturing process, the first blocking structure 510 can be prepared separately, that is, on the basis of existing preparation steps of the array substrate 100, an additional manufacturing process is provided to prepare the first blocking structure 510. The first blocking structure 510 can also be prepared with one layer or several layers of the array substrate 100 at the same time, that is, a number of steps for preparing the array substrate 100 may not increase. Patterns of one layer or several layers of the array substrate 100 can be changed and prepared, this preparation approach does not need other additional manufacturing processes, and the processes are reduced in number and production cost is saved.

However, it should be noted that the present application is not limited to the relative positional relationship between one end of the first blocking structure 510 near the array substrate 100 along a direction perpendicular to the array substrate 100 and the conductive region 12a. In the embodiment, the conductive region 12 is more prominent than the non-conductive region 12b, and a side of the first blocking structure 510 facing the array substrate 100 is closer to the substrate 110 than the pixel electrode layer 160.

Referring to FIG. 2, ata side of each conductive region 12a facing the counter substrate 200, each conductive region 12a is provided with at least one second blocking structure 520, which is located at the conductive region 12a near the printed circuit 300. By providing the second blocking structure 520, the display panel 10 may prevent a metal material used in the printed circuit 300 from overflowing to the display region 11, thereby preventing the metal layer used in the printed circuit 300 from contaminating liquid crystals and affecting display effects.

Specifically, a side of the second blocking structure 520 away from the array substrate 100 is in contact with the counter substrate 200. The second blocking structure 520 may use a photospacer layer 501 or a block matrix as a raw material. In the embodiment, the second blocking structure 520 is a photospacer layer 501. The photospacer layer 501 may be an organic film layer or may be formed by light-sensitive materials such as photoresist.

Referring to FIG. 2 and FIG. 3 continuedly, the counter substrate 200 is arranged parallel to the array substrate 110. The counter substrate 200 and the printed circuit 300 include a third contact P located at a lateral side of the display panel 10 and a fourth contact Q located at a side of the counter substrate 200 facing the array substrate 100.

It should be noted that the counter substrate 200 also includes a display area corresponding to the display region of the display panel 10 and a non-display area corresponding to the non-display region of the display panel 10.

In the embodiment, the counter substrate 200 is a color filter substrate. The display area of the color filter substrate is provided with color resists corresponding to different pixels, and the peripheral area of the color filter substrate is coated with a sealing adhesive to firmly bond the array substrate 100 and the color filter substrate, and an enclosed space is formed, the enclosed space is injected with liquid crystals to form a liquid crystal cell.

The printed circuit 300 is disposed at the periphery of the array substrate 100 and is electrically connected to the conductive region 12a of the array substrate 100.

In the embodiment, the printed circuit 300 is a silver (Ag) printed circuit, and the silver printed circuit refers to a silver ink printed circuit, that is, the electronic ink is made of silver. A partial area of the printed circuit 300 extends between the array substrate 100 and the counter substrate 200, thereby correspondingly adding the second contact N of the array substrate 100 and the fourth contact Q of the counter substrate 200. That is, the display panel 10 further increases the contact area between the color filter substrate and the printed circuit 300.

The COF 400 is disposed at a side of the printed circuit 300 opposite to the display panel 10, and is electrically connected to the printed circuit 300. Alternatively, the COF 400 is electrically connected to the array substrate 100 via the printed circuit 300.

Specifically, the COF 400 includes a driver IC, which is configured to output driving signals of the display panel 10. That is, it is realized that each COF 400 is electrically connected to the conductive region 12a via the printed circuit 300, so that the driving signals of the driver IC can be transmitted to the display panel 10 through the conductive region 12a for display driving and controlling. It should be noted that the present application is not limited to the specific structure of the COF 400.

Figure 4:
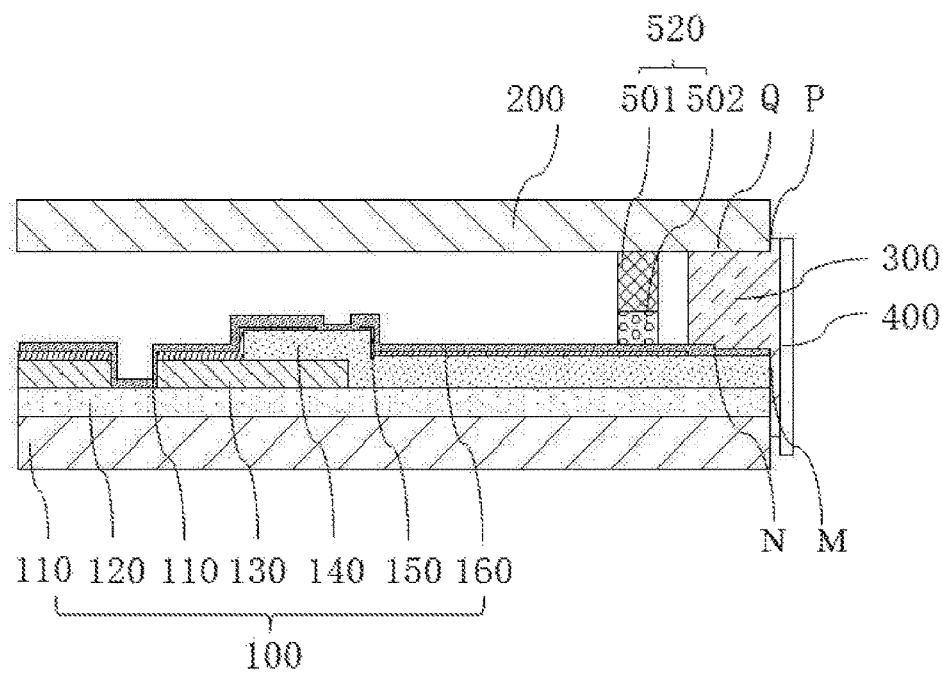
FIG. 4 is a cross-sectional view of the display panel, taken along A-A direction in FIG. 1, according to a second embodiment of the present invention.
Figure 5:
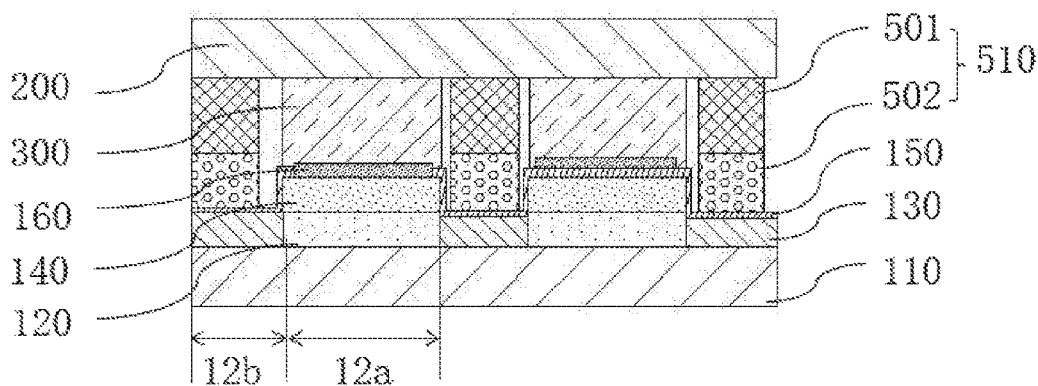
FIG. 5 is a cross-sectional view of the display panel, taken along B-B direction in FIG. 1, according to the second embodiment of the present invention.

FIG. 4 and FIG. 5 are schematic structural diagrams showing another peripheral region of the display panel 10, according to a second embodiment of the present application. As shown in FIG. 4 and FIG. 5, based on the first embodiment mentioned above, the first blocking structure 510 and the second blocking 520 structure adopt a multi-layer structure.

Specifically, the first blocking structure 510 includes a color resist layer 502 and a photospacer layer 501 disposed at a side of the color resist layer 502 away from the array substrate 100. The second blocking structure 520 includes a color resist layer 502 and a photospacer layer 501 disposed at a side of the color resist layer 502 away from the array substrate 100. The photospacer layer 502 may be an organic film layer, and may also be formed by light-sensitive materials such as a photoresist.

By using the color resist layer 502 to raise up the bottom of the photospacer layer 501 to make the bottom of the photospacer layer 501 protrude significantly, so that a thickness of the photospacer layer 501 is reduced, which can further reduce an amount of materials used to form the photospacer layer 501 and further save production cost. The manufacturing approach is simple. That is, in other embodiment, the first blocking structure 510 and the second blocking structure 520 can be other suitable multi-layer structures or formed by using other suitable materials.

Figure 6:
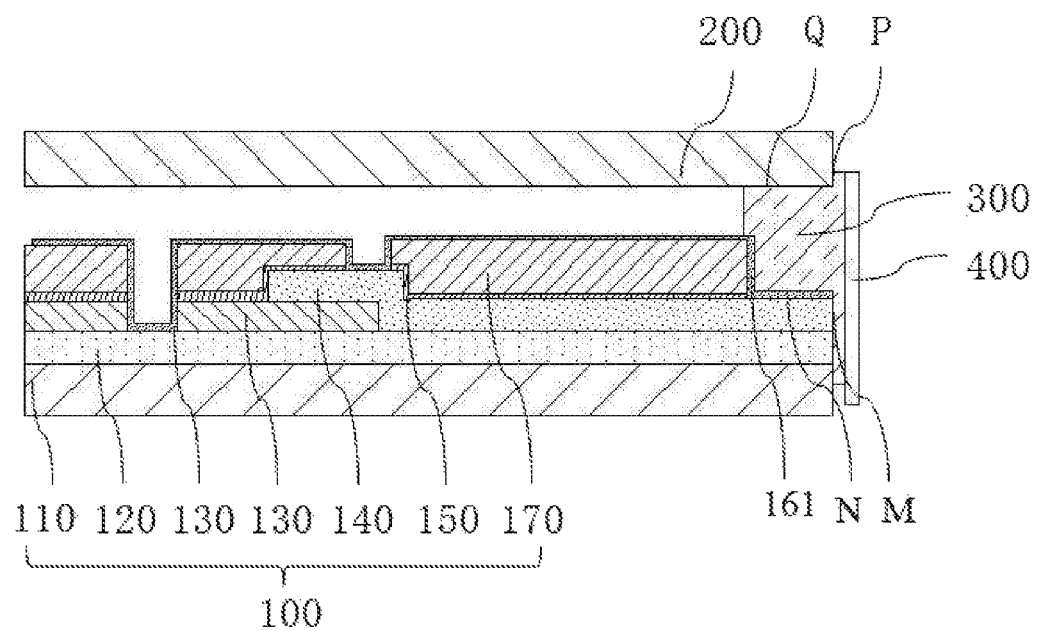
FIG. 6 is a cross-sectional view of the display panel, taken along A-A direction in FIG. 1, according to a third embodiment of the present invention.
Figure 7:
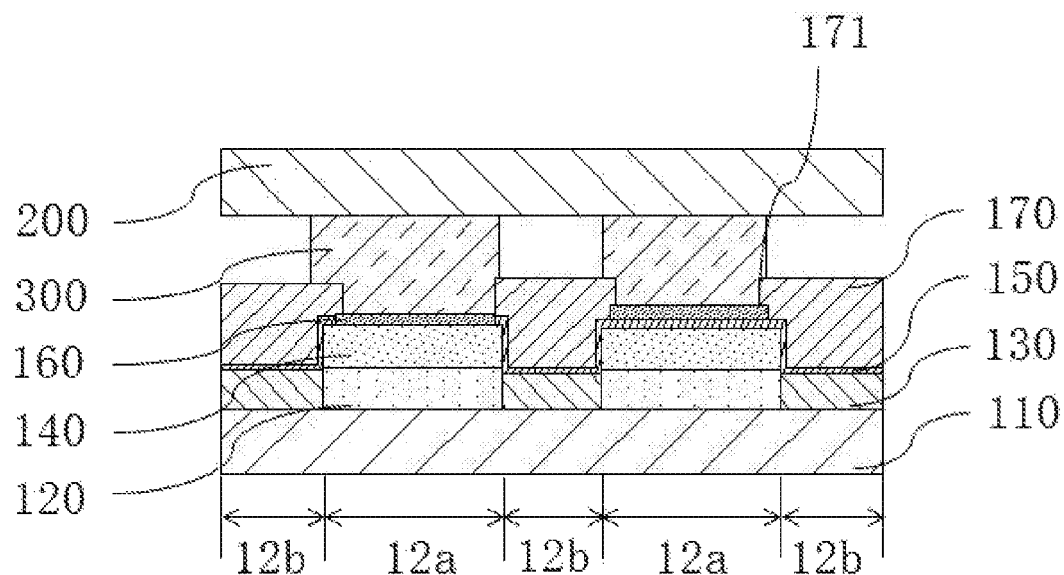
FIG. 7 is a cross-sectional view of the display panel, taken along B-B direction in FIG. 1, according to the third embodiment of the present invention.

FIG. 6 and FIG. 7 are schematic structural diagrams showing another peripheral area of the display panel 10, according to a third embodiment of the present application. As shown in FIGS. 6 and 7, based on the first embodiment mentioned above, an insulation layer 170 is added. By forming protrusions or hollows in different areas of the insulation layer 170, different topographical structures are formed, thereby achieving purposes of preventing the adjacent printed circuits 300 from being connected to each other and preventing a metal layer used in the printed circuit 300 from overflowing to the display region 11.

Referring to FIG. 6 and FIG. 7, the insulation layer 170 is disposed between the passivation layer 150 and the pixel electrode layer 160. A region of the insulation layer 170 corresponding to the second contact N includes a hollow region, and a region of the insulation layer 170 corresponding to the conductive region 12a except a region where the second contact N is located is provided with vias. A region of the insulation layer 170 corresponding to each non-conductive region 12b is provided with a protrusion, and one end of the protrusion away from the substrate is more prominent than the conductive region.

Referring to FIG. 6 and FIG. 7 continuedly, the pixel electrode layer 160 covers the vias formed on the insulation layer 170 and the hollow regions of the insulation layer 170, and the source electrode layer 140 is electrically connected to the pixel electrode layer 160 and the gate electrode layer 120 through the vias and the hollow regions. The pixel electrode layer 160 covers the hollow regions of the insulation layer 170 and forms a stepped surface 161. The pixel electrode layer 160 generates the second contact N through the printed circuit 300 and the stepped surface 161 so that the area of the second contact N can further increase.

By changing patterns of the insulation layer 170 corresponding to the conductive region 12a, the insulation layer 170 changes topographic structures of the pixel electrode layer 160, an area of the second contact N can further increase and the contact impedance can be reduced. Moreover, a region of the insulation layer 170 corresponding to the second contact N is a hollow region, it does not affect the relative distance between the array substrate 100 and the counter substrate 200, and thus does not affect the thickness of the display panel 10.

Referring to FIG. 6 and FIG. 7 continuedly, in a region of the insulation layer 170 corresponding to the non-conductive region 12b, at least one protrusion is more prominent than the conductive region 12a, and a concave structure 171 is formed between adjacent protrusions. The concave structure 171 is located at the conductive region 12a, thereby increasing the metal-flow difficulty, and further preventing the adjacent printed circuits 300 from being connected to each other.

In the embodiment, the display panel 10 uses a hollow pattern or a protruded pattern of the insulation layer 170 in the conductive region 12a and the non-conductive region 12b to form the stepped surface 161 in the conductive region 12a and the concave structure 171 in the non-conductive region 12b, thereby achieving the effect of preventing the adjacent printed circuits 300 from being connected to each other and preventing a metal layer used in the printed circuit 300 from overflowing to the display area.

That is, various topographic structures are formed by using the film layer of the array substrate 100 or adding a film layer and patterning the film layer to form a hollow topography or a concave topography, or by using the difference in thickness of the same film layer in different regions. The various topographic structures can further prevent technical problems, such as preventing the adjacent printed circuits 300 from being connected to each other or prevent a metal used in the printed circuit 300 from overflowing to the display area.

Specifically, the insulation layer 170 may be at least one of a dielectric layer, a planarization layer, and a passivation layer. A material of the insulation layer 170 may be an inorganic material selected from at least one of silicon oxide and silicon nitride, or an organic material selected from at least one of colorless transparent polyimide, polyurethane, polyethylene terephthalate, and polyethylene naphthalate. In an actual manufacturing process, the insulation layer made of the inorganic material is formed by ALD or PECVD, and the insulation layer made of the organic material is formed by inkjet printing (IJP) or spin coating. That is, the insulation layer 170 may be only a single-layer or multi-layer inorganic insulation layer (PVX), and it may also a multi-layer structure with alternatively stacked inorganic insulation layers and organic insulation layers. In the embodiment, the materials and the number of structural layers are not limited.

Figure 8:
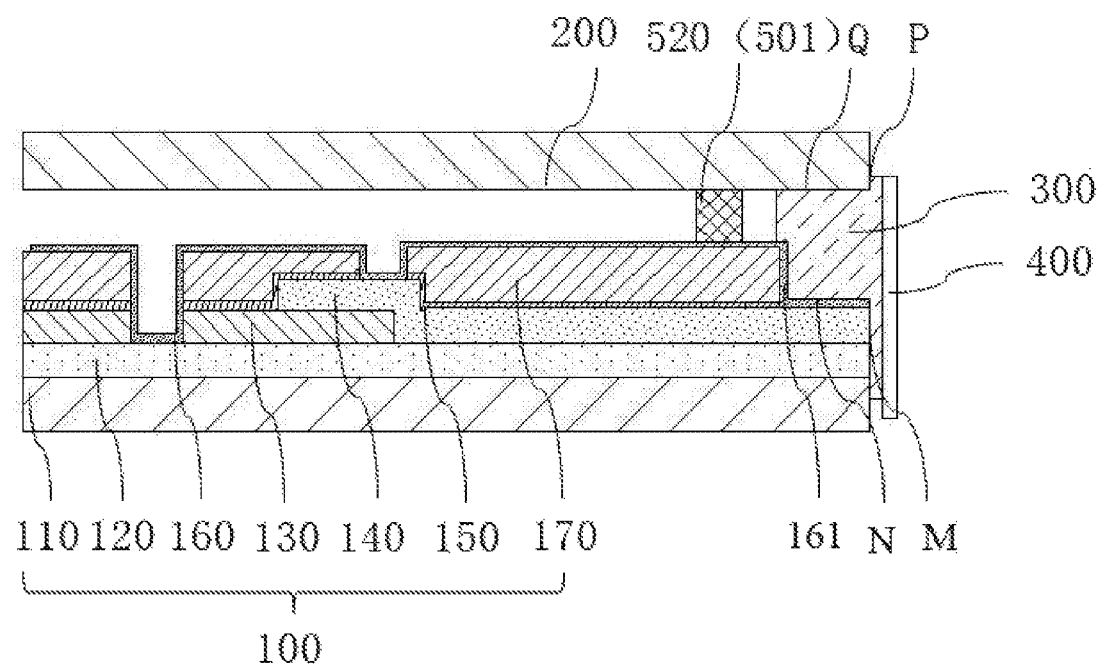
FIG. 8 is a cross-sectional view of the display panel, taken along A-A direction in FIG. 1, according to a fourth embodiment of the present invention.
Figure 9:
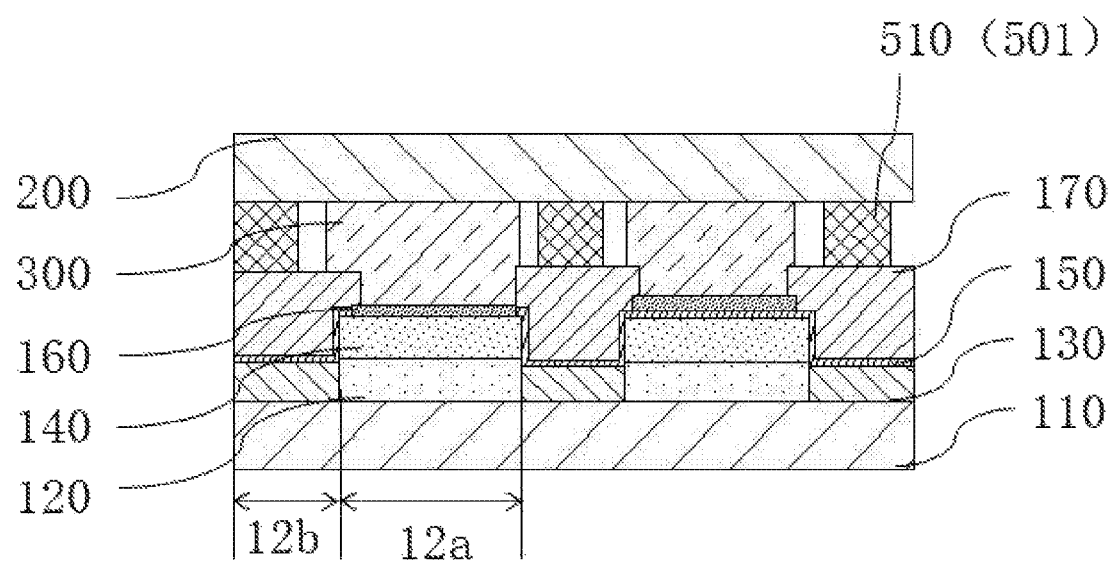
FIG. 9 is a cross-sectional view of the display panel, taken along B-B direction in FIG. 1, according to the fourth embodiment of the present invention.

FIG. 8 and FIG. 9 are schematic structural diagrams showing another peripheral area of the display panel 10, according to a fourth embodiment of the present application. As shown in FIG. 8 and FIG. 9, based on the first embodiment mentioned above, an insulation layer 170 is added to the array substrate 100 of the display panel 10, and on this basis, a first blocking structure 510 and a second blocking structure 520 are further added. The display panel 10 can further improve the blocking performance by adding the first blocking structure 510 and the second blocking structure 520, wherein both of the first blocking structure 510 and the second blocking structure 520 are a photospacer layer 501.

The present application further provides a display device including the display panel 10 mentioned above. The display device may be used in a mobile phone, a tablet, a computer monitor, a television, or the like.

Since the display device provided by the embodiments of the present application includes the display panel 10 described above, the display device provided by the present application also resolves the same technical problems and achieves the same technical effect, and therefore is not detailed herein. Other structures of the display device are well known to persons skilled in the art, and are not repeated herein.

The above is only some preferred embodiments of the present application. It should be noted that, for persons skilled in this art, various modifications and alterations can be made without departing from the principles of the present application, the modifications and the alterations should be considered as a protection scope of the present application.

What is claimed is:

1. A display panel, comprising:
an array substrate, wherein a peripheral region of the array substrate comprises one or more conductive regions and one or more non-conductive regions that separate the conductive regions;
a counter substrate disposed opposite to the array substrate; and
one or more chip-on-films (COFs), wherein each of the COFs is electrically connected to one of the conductive regions via a printed circuit, and the conductive region and the printed circuit corresponding to the conductive region comprise a first contact located at a lateral side of the array substrate of the display panel, and a second contact located at a side of the conductive region facing the counter substrate;
wherein at a side of each of the non-conductive regions facing the counter substrate, each of the non-conductive regions is provided with a first blocking structure configured to prevent adjacent printed circuits from being connected to each other, and the first blocking structure comprises a color resist layer and a photospacer layer disposed at a side of the color resist layer away from the array substrate.

2. The display panel as claimed in claim 1, wherein the printed circuit and the counter substrate comprise:
a third contact located at a lateral side of the display panel; and
a fourth contact located at a side of the counter substrate facing the array substrate.

3. A display panel, comprising:
an array substrate, wherein a peripheral region of the array substrate comprises one or more conductive regions and one or more non-conductive regions that separate the conductive regions;
a counter substrate disposed opposite to the array substrate; and
one or more chip-on-films (COFs), wherein each of the COFs is electrically connected to one of the conductive regions via a printed circuit, and the conductive region and the printed circuit corresponding to the conductive region comprise a first contact located at a lateral side of the array substrate of the display panel, and a second contact located at a side of the conductive region facing the counter substrate;
wherein at a side of each of the conductive regions facing the counter substrate, each of the conductive regions is provided with a blocking structure, which is located at one end of the conductive region near the printed circuit to prevent a metal material of the printed circuit from overflowing to a display region, and the blocking structure comprises a color resist layer and a photospacer layer disposed at a side of the color resist away from the array substrate.

4. The display panel as claimed in claim 3, wherein at a side of each of the non-conductive regions facing the counter substrate, each of the non-conductive regions is provided with a first blocking structure, the first blocking structure is configured to prevent adjacent printed circuits from being connected to each other.

5. The display panel as claimed in claim 4, wherein the first blocking structure is a photospacer layer.

6. The display panel as claimed in claim 4, wherein the first blocking structure comprises a color resist layer and a photospacer layer disposed at a side of the color resist layer away from the array substrate.

7. The display panel as claimed in claim 3, wherein the printed circuit and the counter substrate comprise:
a third contact located at a lateral side of the display panel; and
a fourth contact located at a side of the counter substrate facing the array substrate.

8. The display panel as claimed in claim 7, wherein the printed circuit is a silver printed circuit.

9. A display panel, comprising:
an array substrate, wherein a peripheral region of the array substrate comprises one or more conductive regions and one or more non-conductive regions that separate the conductive regions;
a counter substrate disposed opposite to the array substrate; and
one or more chip-on-films (COFs), wherein each of the COFs is electrically connected to one of the conductive regions via a printed circuit, and the conductive region and the printed circuit corresponding to the conductive region comprise a first contact located at a lateral side of the array substrate of the display panel, and a second contact located at a side of the conductive region facing the counter substrate;
wherein the peripheral region of the array substrate further comprises a substrate, a gate electrode layer, a gate insulation layer, a source electrode layer, a passivation layer, an insulation layer, and a pixel electrode layer along a direction from the array substrate to the counter substrate, a region of the insulation layer corresponding to the second contact is provided with a hollow region, and the pixel electrode layer covers the hollow region and forms a stepped surface.

10. The display panel as claimed in claim 9, wherein the insulation layer is formed by one or more than one of silicon oxide (SiOx) and silicon nitride (SiNx).

11. The display panel as claimed in claim 9, wherein the insulation layer is formed by one or more than one of transparent colorless polyimide, polyurethane, polyethylene terephthalate and polyethylene naphthalate.

12. The display panel as claimed in claim 9, wherein the non-conductive region comprises the substrate, the gate insulation layer, the passivation layer and the insulation layer.

13. The display panel as claimed in claim 9, wherein a region of the insulation layer corresponding to the non-conductive region is provided with a protrusion, and one end of the protrusion away from the substrate is more prominent than the conductive region.

14. The display panel as claimed in claim 9, wherein the printed circuit and the counter substrate comprise:
a third contact located at a lateral side of the display panel; and
a fourth contact located at a side of the counter substrate facing the array substrate.

15. The display panel as claimed in claim 9, wherein the printed circuit is a silver printed circuit.

* * * * *